(12) United States Patent
Hauenstein (10) Patent No.: US 8,987,777 B2
(45) Date of Patent: Mar. 24, 2015

(54) STACKED HALF-BRIDGE POWER MODULE

(75) Inventor: Henning M. Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/188,002

(22) Filed: Jul. 21, 2011

(65) Prior Publication Data

US 2013/0015495 A1    Jan. 17, 2013

Related U.S. Application Data

(60) Provisional application No. 61/506,468, filed on Jul. 11, 2011.

(51) Int. Cl.
*H01L 29/739* (2006.01)
*H01L 25/07* (2006.01)
*H05K 7/20* (2006.01)

(52) U.S. Cl.
CPC ............ *H01L 25/074* (2013.01); *H01L 25/071* (2013.01); *H01L 25/072* (2013.01); *H05K 7/209* (2013.01); *H01L 2924/0002* (2013.01)
USPC .................................. 257/140; 257/E29.197

(58) Field of Classification Search
USPC ........................................................ 257/140
See application file for complete search history.

(56) References Cited

U.S. PATENT DOCUMENTS

| | | | | |
|---|---|---|---|---|
| 5,532,512 | A * | 7/1996 | Fillion et al. ................... | 257/686 |
| 6,278,179 | B1 * | 8/2001 | Mermet-Guyennet ....... | 257/686 |
| 7,508,060 | B2 * | 3/2009 | Carney et al. ................. | 257/686 |
| 7,554,188 | B2 | 6/2009 | Hauenstein | |
| 7,619,302 | B2 | 11/2009 | Hauenstein | |
| 8,018,056 | B2 | 9/2011 | Hauenstein | |
| 2002/0024129 | A1 | 2/2002 | Hirahara | |
| 2002/0190374 | A1 | 12/2002 | Nakajima | |
| 2004/0089934 | A1 * | 5/2004 | Shimoida et al. ............. | 257/686 |
| 2004/0227231 | A1 * | 11/2004 | Maly et al. ..................... | 257/724 |
| 2006/0169976 | A1 | 8/2006 | Kameda | |
| 2007/0120217 | A1 | 5/2007 | Otremba | |
| 2007/0246812 | A1 * | 10/2007 | Zhuang ......................... | 257/678 |
| 2007/0290311 | A1 * | 12/2007 | Hauenstein ................... | 257/685 |
| 2010/0308421 | A1 | 12/2010 | Muto | |

FOREIGN PATENT DOCUMENTS

JP        2005-303018        10/2005

OTHER PUBLICATIONS

U.S. Appl. No. 13/075,597, filed Mar. 30, 2011, Hauenstein.
U.S. Appl. No. 13/088,573, filed Apr. 18, 2011, Hauenstein.
U.S. Appl. No. 13/094,695, filed Apr. 26, 2011, Hauenstein.

* cited by examiner

*Primary Examiner* — Zandra Smith
*Assistant Examiner* — Lawrence Tynes, Jr.
(74) *Attorney, Agent, or Firm* — Farjami & Farjami LLP (57) ABSTRACT

According to an exemplary embodiment, a stacked half-bridge power module includes a high side device having a high side power terminal coupled to a high side substrate and a low side device having a low side power terminal coupled to a low side substrate. The high side and low side devices are stacked on opposite sides of a common conductive interface. The common conductive interface electrically, mechanically, and thermally couples a high side output terminal of the high side device to a low side output terminal of the low side device. The high side device and the low side device can each include an insulated-gate bipolar transistor (IGBT) in parallel with a diode.

20 Claims, 4 Drawing Sheets

STACKED HALF-BRIDGE POWER MODULE

The present application claims the benefit of and priority to a pending provisional application titled "Stacked Half-Bridge Power Module," Ser. No. 61/506,468 filed on Jul. 11, 2011. The disclosure in that pending provisional application is hereby incorporated fully by reference into the present application.

BACKGROUND OF THE INVENTION

1. Field of the Invention

The present invention is generally in the field of semiconductors. More particularly, the invention relates to the packaging of semiconductor dies.

2. Background Art

A power module having power devices can be used in high voltage and high current applications. The power module can include a half-bridge where the power devices are high side and low side devices that include, for example, an insulated-gate bipolar transistor (IGBT) or a power metal-oxide-semiconductor field-effect transistor (MOSFET) as a power switch. Each power switch can be provided on a respective die and is commonly in parallel with a diode, for example a freewheeling diode, which can be on the same or a different die than the power switch.

Although the power switch and the diode may be capable of high performance, performance of the power switch and the diode can be limited by how the dies are packaged. For example, electromagnetic interference (EMI) and parasitics are of great concern when connecting the dies in the power module. Furthermore, the power devices typically generate significant heat, which can degrade performance of the power switch and the diode if not sufficiently dissipated from the power devices.

One approach to packaging power devices in a power module is to connect high and low side devices that are arranged side by side on a substrate. Each of the high side and low side devices can have one or more die and conductive traces on the substrate that can be used as interconnects for the dies to form a half-bridge. However, using this approach, the conductive traces would likely require long routing paths on the substrate, and form undesirably asymmetric current paths with high parasitic inductivity and resistance. Also, as the substrate must accommodate the conductive traces and the dies, the substrate would be large and expensive. Thus, this approach would result in a power module having a large form factor and low power density. Furthermore, if bond wires were utilized to connect to the dies, it would be difficult to provide a heat sink to sufficiently dissipate heat from the high side and low side devices.

It would be desirable to provide power modules, with high side and low side devices, which are capable of overcoming the drawbacks and deficiencies described above.

SUMMARY OF THE INVENTION

A stacked half-bridge power module, substantially as shown in and/or described in connection with at least one of the figures, and as set forth more completely in the claims.

DETAILED DESCRIPTION OF THE INVENTION

The present invention is directed to a stacked half-bridge power module. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
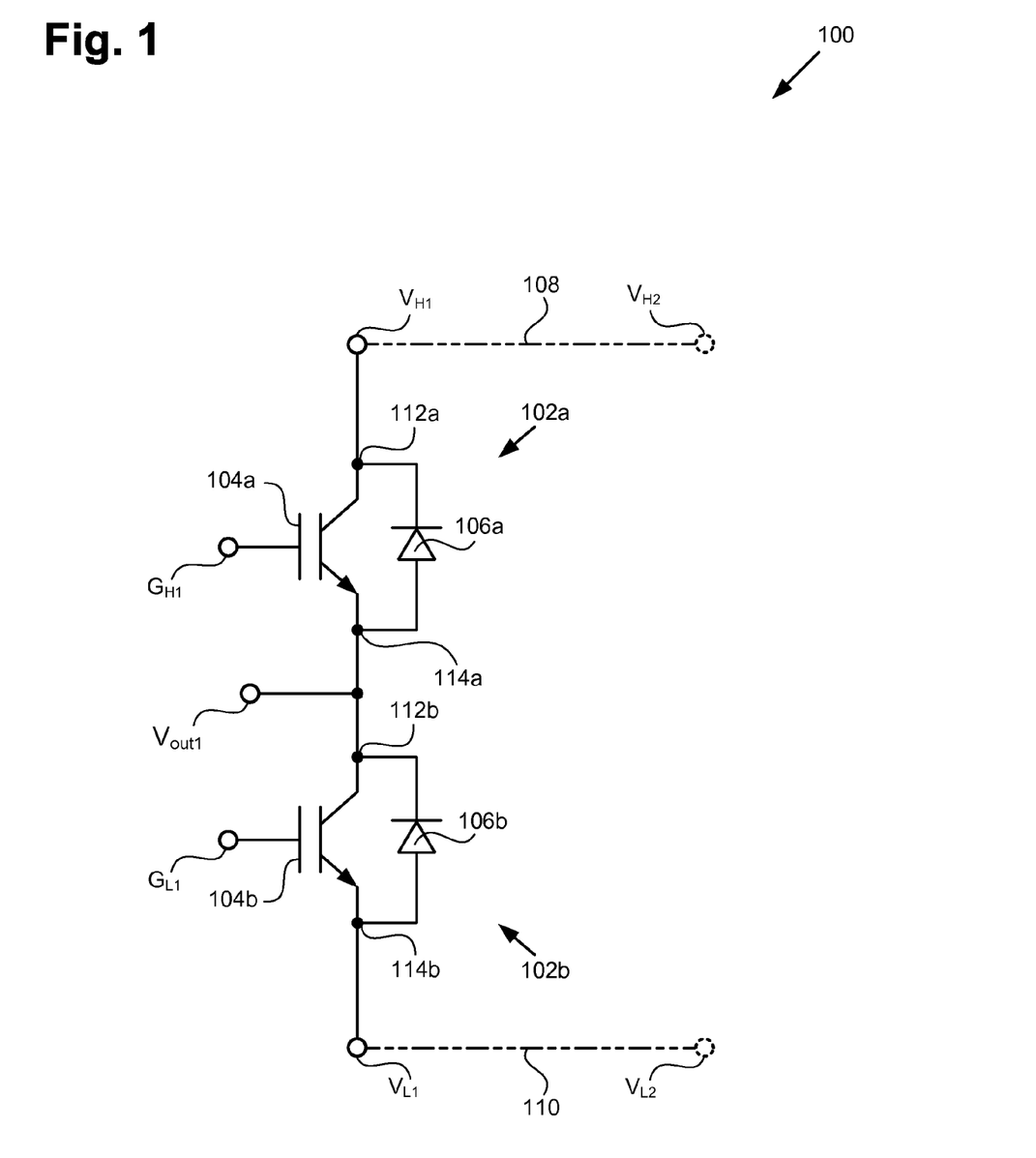
FIG. 1 shows an exemplary circuit schematic of a stacked half-bridge power module, according to one embodiment of the invention.

FIG. 1 shows an exemplary schematic of stacked half-bridge power module circuit 100 (also referred to as "power module circuit"), according to one embodiment of the invention. In the present embodiment, power module circuit 100 is a half-bridge circuit comprising high side device 102a and low side device 102b (also referred to herein as power devices 102).

In the present embodiment, high side device 102a is a high side insulated-gate bipolar transistor (IGBT)/diode device having IGBT 104a and diode 106a. IGBT 104a is a power switch and diode 106a is a freewheeling diode that is parallel with, and more particularly, antiparallel with, IGBT 104a. Similarly, low side device 102b is a low side IGBT/diode device having IGBT 104b and diode 106b. IGBT 104b is a power switch and diode 106b is a freewheeling diode that is parallel with, and more particularly, antiparallel with, IGBT 104b. It is noted that the connections of IGBT 104a and diode 106a and IGBT 104b and diode 106b are not antiparallel in some embodiments of the present invention. For example, diodes 106a and 106b can each have their polarities reversed from what is shown in FIG. 1.

High side device 102a has high side power terminal 112a (also referred to herein as "collector terminal" and "collector/cathode terminal") that is coupled to a collector of IGBT 104a and a cathode of diode 106a. Similarly, low side device 102b has low side power terminal 114b (also referred to herein as "emitter terminal" and "emitter/anode terminal") that is coupled to an emitter of IGBT 104b and an anode of diode 106b.

High side device 102a also has high side output terminal 114a (also referred to herein as "emitter terminal" and "emitter/anode terminal") that is coupled to an emitter of IGBT 104a and an anode of diode 106a. Similarly, low side device 102b has low side output terminal 112b (also referred to herein as "collector terminal" and "collector /cathode terminal") coupled to a collector of IGBT 104b and a cathode of diode 106b. FIG. 1 shows that high side output terminal 114a is coupled to low side output terminal 112b.

Also in the present embodiment, high side device 102a has high side input terminal $G_{H1}$ (also referred to herein as "gate terminal"), which is coupled to a gate of IGBT 104a. Similarly, low side device 102b has low side input terminal $G_{L1}$ (also referred to herein as "gate terminal"), which is coupled to a gate of IGBT 104b.

In the present embodiment, power module circuit 100 has high side supply terminal $V_{H1}$ coupled to high side power terminal 112a of high side device 102a and has low side supply terminal $V_{L1}$ coupled to low side power terminal 114b of low side device 102b. High side supply terminal $V_{H1}$ is configured to receive a high side supply voltage and low side supply terminal $V_{L1}$ is configured to receive a low side supply voltage. Power module circuit 100 also has half-bridge output terminal $V_{out1}$ (also referred to herein as "common conductive interface terminal"), which is formed by high side output terminal 114a coupled to low side output terminal 112b. Additionally, high side input terminal $G_{H1}$ and low side input terminal $G_{L1}$ are respective high side and low side input terminals of power module circuit 100. High side input terminal $G_{H1}$ can be used to selectively enable and disable IGBT 102a and low side input terminal $G_{L1}$ can be used to selectively enable and disable IGBT 102b, as is known in the art.

Although in the present example, power devices 102 each include an IGBT (i.e. IGBTs 104a and 104b) as a power switch, power devices 102 can comprise a different power switch, such as a power metal-oxide-semiconductor field-effect transistor (MOSFET). In some embodiments, IGBT 104a is replaced by a MOSFET and diode 106a is a body diode of the MOSFET. In other embodiments, IGBT 104a is replaced by a high electron mobility transistor (HEMT). IGBT 104b can similarly be replaced by a MOSFET or a HEMT, as examples. Also, in some embodiments, power devices 102 may not include diodes 106a and 106b or may include electrical components other than or in addition to diodes 106a and 106b.

It is further noted that, in accordance with embodiments of the present invention, power module circuit 100 is not limited to the circuit shown in FIG. 1. For example, power module circuit 100 can include another half-bridge circuit with another high side device and another low-side device, as will be described with respect to FIG. 3. The another half-bridge can form a full-bridge with the half-bridge shown in FIG. 1. The another half-bridge and the half-bridge shown in FIG. 1 can also form respective phases of a multi-phase inverter.

Thus, as described above, in one embodiment, the present invention provides for stacked half-bridge power module circuit 100 having power devices 102 that can be used in high voltage and high current applications. As one specific example, in some embodiments power devices 102 have a breakdown voltage of approximately 1200 volts. Power devices 102 can be provided on one or more dies. While IGBTs 104a and 104b and diodes 106a and 106b are capable of high performance, their performance can be limited by how the dies are packaged. For example, electromagnetic interference (EMI) and parasitics are of great concern when connecting the dies to form power module circuit 100. Furthermore, power devices 102 typically generate significant heat, which can degrade performance of IGBTs 104a and 104b and diodes 106a and 106b if not sufficiently dissipated from power devices 102.

In accordance with various embodiments of the present invention, a stacked half-bridge power module can have short routing paths with highly symmetric current paths. Furthermore, the stacked half-bridge power module can have a small form factor and high power density while easily accommodating a heat sink to dissipate heat from power devices 102. As such, dies forming power devices 102 can be packaged with low electromagnetic interference (EMI) and low parasitics in the stacked half-bridge power module. Furthermore, heat generated by power devices 102 can be sufficiently dissipated from power devices 102 in the stacked half-bridge power module. Thus, the stacked half-bridge power module does not significantly limit performance of IGBTs 104a and 104b and diodes 106a and 106b.

Figure 2A:
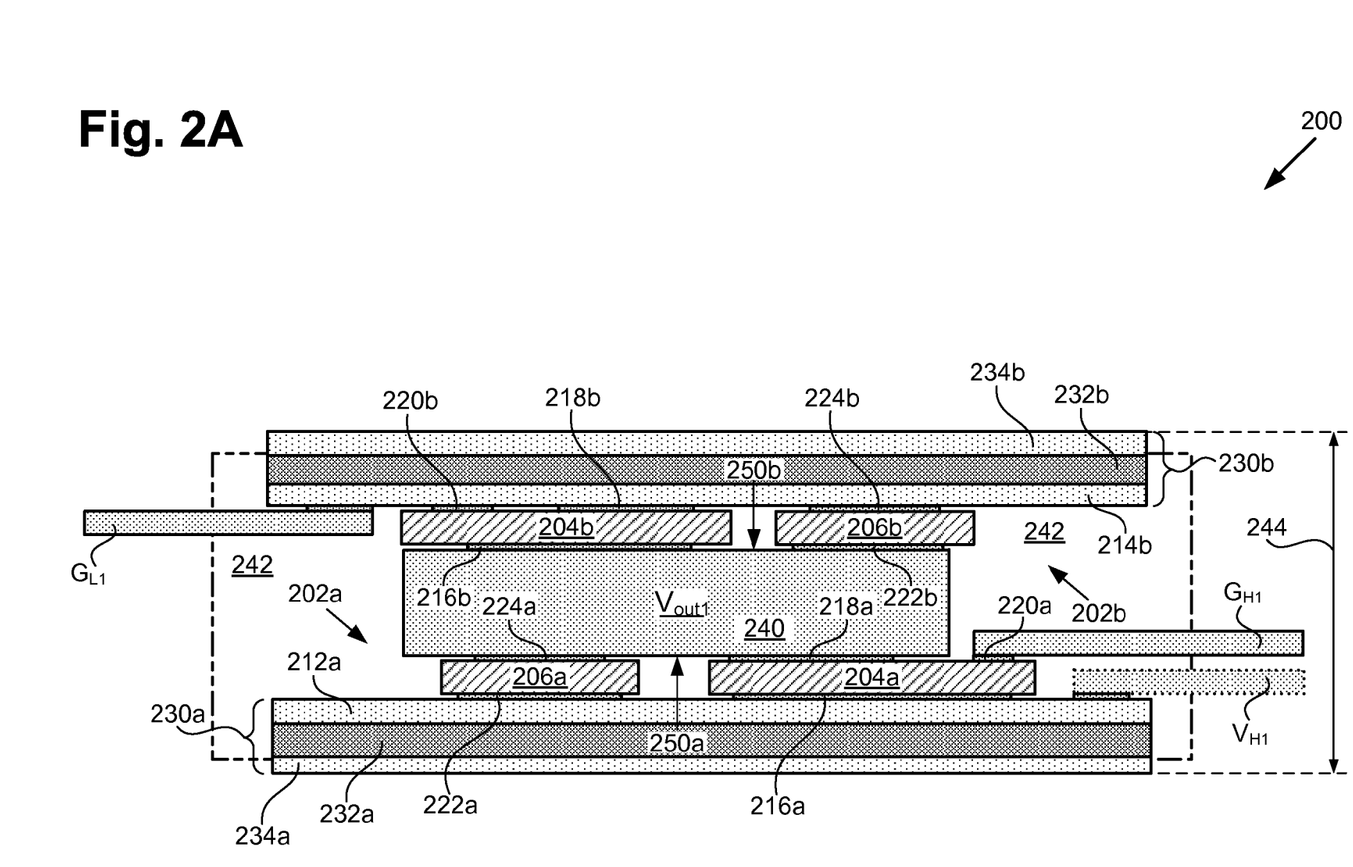
FIG. 2A illustrates a cross-sectional view of an exemplary stacked half-bridge power module, according to one embodiment of the present invention.
Figure 2B:
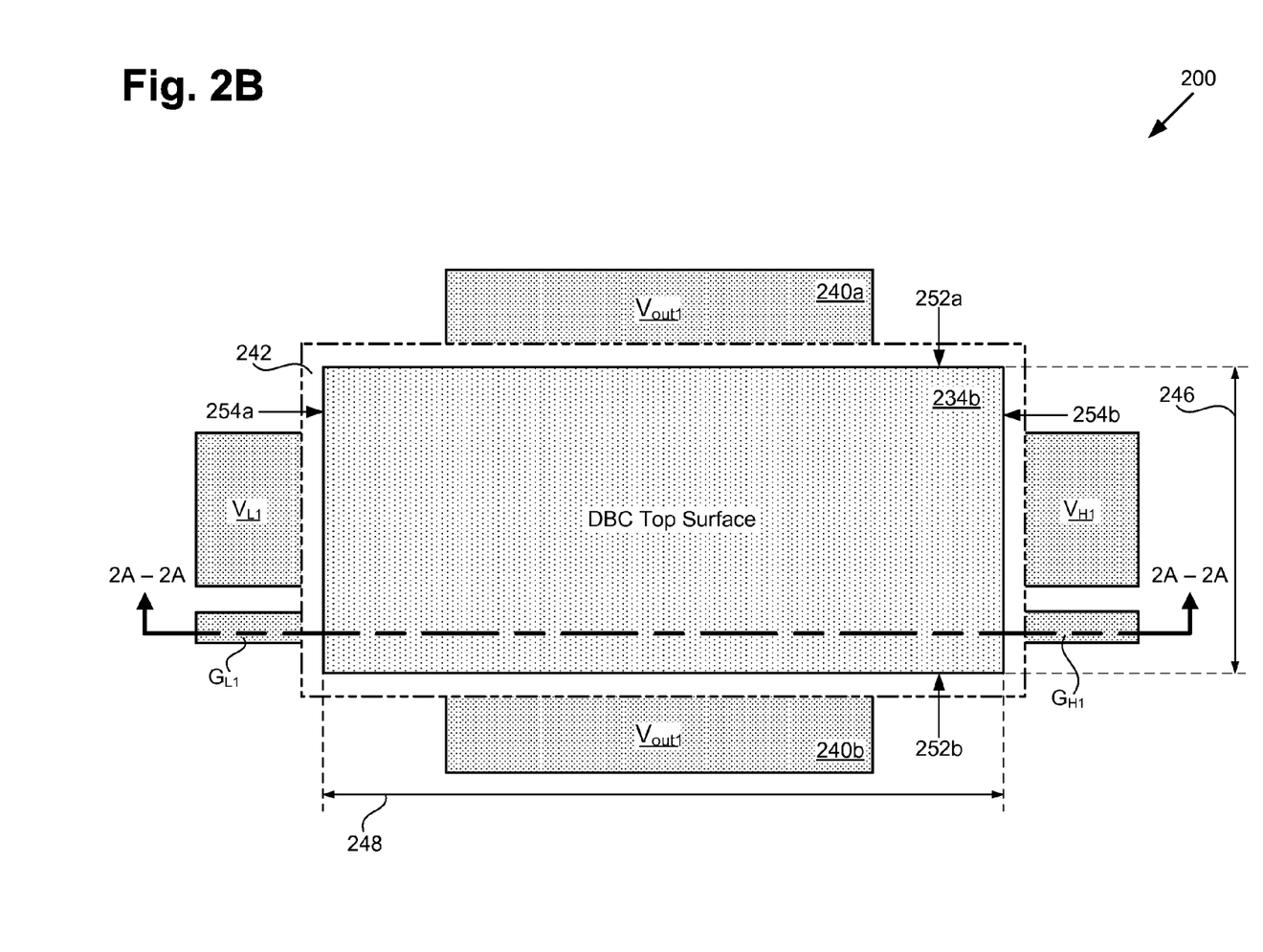
FIG. 2B illustrates a top view of an exemplary stacked half-bridge power module, according to one embodiment of the present invention.

Referring now to FIGS. 2A and 2B, FIG. 2A illustrates a cross-sectional view of stacked half-bridge power module 200 (also referred to herein as "power module"), according to one embodiment of the present invention. FIG. 2B illustrates a top view of stacked half-bridge power module 200, according to one embodiment of the present invention. The cross-sectional view in FIG. 2A is indicated by line 2A-2A in FIG. 2B. Power module circuit 100 in FIG. 1 corresponds to a schematic representation of power module 200 in FIGS. 2A and 2B.

Power module 200 includes high side supply terminal $V_{H1}$, low side supply terminal $V_{L1}$ (not shown in FIG. 2A), high side input terminal $G_{H1}$, low side input terminal $G_{L1}$ and half-bridge output terminal $V_{out1}$ corresponding respectively to high side supply terminal $V_{H1}$, low side supply terminal $V_{L1}$, high side input terminal $G_{H1}$, low side input terminal $G_{L1}$ and half-bridge output terminal $V_{out1}$ in power module circuit 100. It is noted that low side supply terminal $V_{L1}$ is not shown in FIG. 2A as it is behind and obscured by low side input terminal $G_{L1}$. Furthermore, high side supply terminal $V_{H1}$ is depicted with a dotted outline in FIG. 2A to indicate depth as it is behind, but not obscured by high side input terminal $G_{H1}$.

Power module 200 also includes high side device 202a and low side device 202b corresponding respectively to high side device 102a and low side device 102b in FIG. 1. High side device 202a includes IGBT die 204a and diode die 206a corresponding respectively to IGBT 104a and diode 106a in FIG. 1 and low side device 202b includes IGBT die 204b and diode die 206b corresponding respectively to IGBT 104b and diode 106b in FIG. 1.

IGBT die 204a includes collector 216a on a bottom surface thereof and emitter 218a and gate 220a on a top surface thereof and diode 206a includes cathode 222a on a bottom surface thereof and anode 224a on a top surface thereof. Similarly, IGBT die 204b includes collector 216b on a bottom surface thereof and emitter 218b and gate 220b on a top surface thereof and diode 206b includes cathode 222b on a top surface thereof and anode 224b on a bottom surface thereof. While IGBT die 204a and diode die 206a are separate dies, in some embodiments, IGBT die 204a and diode die 206a can be a single IGBT/diode die. Similarly, IGBT die 204b and diode die 206b can be a single IGBT/diode die.

Power module 200 further includes high side substrate 230a, low side substrate 230b, and common conductive interface 240. High side device 202a is on high side substrate 230a and common conductive interface 240 and low side device 202b is on low side substrate 230b and common conductive interface 240. High side substrate 230a includes conductive layers 212a and 234a and dielectric layer 232a. Similarly, low side substrate 230b includes conductive layers 214b and 234b and dielectric layer 232b.

Conductive layers 234a and 234b are outer conductive layers of respective high side and low side substrates 230a and 230b and may be referred to as high side conductive layer 234a and low side conductive layer 234b. Conductive layer 234a is electrically insulated from high side device 202a by dielectric layer 232a. Similarly, conductive layer 234b is electrically insulated from low side device 202b by dielectric layer 232b.

In the present embodiment, high side substrate 230a and low side substrate 230b are each direct bonded copper (DBC) substrates. For example, dielectric layers 232a and 232b can be ceramic and conductive layers 212a, 214b, 234a and 234b can be copper layers bonded to respective surfaces of dielectric layers 232a and 232b. High side substrate 230a and low side substrate 230b can be substrates other than DBC substrates. As one example, in some embodiments, high side substrate 230a and low side substrate 230b are not copper based, as described above, but are aluminum based. As, in the present embodiment, high side substrate 230a and low side substrate 230b are thermally conductive, power module 200 can advantageously have heat from high side device 202a and low side device 202b dissipated through both top and bottom sides thereof. For example, in one embodiment, one or more heat sinks are on conductive layers 234a and/or 234b.

In power module 200, high side device 202a has a high side power terminal (collector/cathode terminal) coupled to high side substrate 230a, corresponding to high side power terminal 112a in FIG. 1. More particularly, collector 216a of IGBT die 204a is electrically coupled to cathode 222a of diode die 206a through conductive layer 212a. In the present embodiment, high side supply terminal $V_{H1}$ of power module 200 is a copper lead and is electrically and mechanically connected to conductive layer 212a. Similarly, low side device 202b has a low side power terminal (emitter/anode terminal) coupled to low side substrate 230b. More particularly, emitter 218b of IGBT die 204b is coupled to anode 224b of diode die 206b through conductive layer 214b. In the present embodiment, low side supply terminal $V_{L1}$ of power module 200 is a copper lead and is electrically and mechanically connected to conductive layer 214b.

Also in power module 200, low side device 202b has gate 220b corresponding to a gate of IGBT 104b in FIG. 1, that is coupled to low side substrate 230b. In the present embodiment, gate terminal $G_{L1}$ comprises a copper lead and is electrically connected to conductive layer 214b of low side substrate 230b and gate 220b of IGBT die 204b. However, gate terminal $G_{L1}$ and gate 220b are electrically isolated from emitter 218b of IGBT die 204b and anode 224b of diode die 206b. This electrical isolation can be accomplished by appropriately removing a portion of conductive layer 214b to expose dielectric layer 232b (not shown in FIGS. 2A and 2B). In the present embodiment, high side device 202a has gate terminal $G_{H1}$ that is a copper lead and is electrically connected to a top surface of IGBT die 204a (i.e. to gate 220a of IGBT die 204a). As such, a portion of conductive layer 212a need not be removed to electrically isolate gate terminal $G_{H1}$ and gate 220a from emitter 218a and anode 224a. Although the present embodiment shows a beneficial bondwireless implementation of power module 200, in some embodiments gate terminals $G_{L1}$ and $G_{H1}$ can be bond wires.

FIG. 2A shows high side device 202a and low side device 202b being stacked on opposite sides of common conductive interface 240. For example, high side device 202a is stacked on side 250a of common conductive interface 240 and low side device 202b is stacked on side 250b of common conductive interface 240. Thus, high side device 202a, low side device 202b, and common conductive interface 240 form a vertical stack that allows power module 200 to have a small footprint and form factor. For example, as high side device 202a and low side device 202b are stacked over one another, the foot print of stacked half-bridge power module 200 can be approximately half that of power modules where power devices are arranged side by side. As such, high side substrate 230a and low side substrate 230b can be small and inexpensive and power module 200 can have high power density. As specific examples, power module 200 can have thickness 244 of less than or equal to approximately seven micrometers. Length 248 of power module 200 can be less than or equal to approximately thirty micrometers and width 246 of power module 200 can be less than or equal to approximately fifteen micrometers.

Common conductive interface 240 is electrically, mechanically, and thermally coupling a high side output terminal (emitter/anode terminal) of high side device 202a, corresponding to high side output terminal 114a in FIG. 1, to a low side output terminal (collector/cathode terminal) of low side device 202b, corresponding to low side output terminal 112b in FIG. 1. IGBT die 204a and diode die 206a are electrically, mechanically, and thermally coupled to side 250a of common conductive interface 240 and IGBT die 204b and diode die 206b are electrically, mechanically, and thermally coupled to side 250b of common conductive interface 240. The high side output terminal is formed by IGBT die 204a and diode die 206a stacked on side 250a of common conductive interface 240. The low side output terminal is formed by IGBT die 204b and diode die 206b stacked on side 250b of common conductive interface 240.

In some embodiments, common conductive interface 240 is a conductive lead. For example, common conductive interface 240 can be a metal or metal alloy. In one embodiment, common conductive interface 240 is copper. In some embodiments common conductive interface 240 comprises a substrate. For example, common conductive interface 240 is a substrate having conductive vias (not shown in FIGS. 2A and 2B) that are electrically coupling the high side output terminal of high side device 202a to the low side output terminal of low side device 202b. Common conductive interface 240 can be, for example, a DBC, an insulated metal substrate (IMS), a printed circuit board (PCB), or other type of substrate.

By including common conductive interface 240, stacked half-bridge power module 200 can advantageously avoid having long routing paths and asymmetric current paths. For example, in the present embodiment, the length of the connection between high side device 202a and low side device 202b in power module 200 is primarily determined by the thickness of common conductive interface 240, which can be, for example, approximately two millimeters. As such, the connection between high side device 202a and low side device 202b can have low parasitic resistance and inductance. Furthermore, IGBT die 204a can be placed close to diode die 206a and IGBT die 204b can be placed close to diode die 206b, thereby achieving low EMI and parasitics.

In some embodiments, various electrical connections amongst any of high side device 202b, low side device 202a, common conductive interface 240, high side substrate 230b, low side substrate 230a, gate terminals $G_{L1}$ and $G_{H1}$, low side supply terminal $V_{L1}$, and high side supply terminal $V_{H1}$, can be made by utilizing solder, such as lead-free solder. Also, in some embodiments, various electrical connections amongst any of high side device 202b, low side device 202a, common conductive interface 240, high side substrate 230b, low side substrate 230a, gate terminals $G_{L1}$ and $G_{H1}$, low side supply terminal $V_{L1}$, and high side supply terminal $V_{H1}$, can be made by utilizing sinter or sinter alloy. As one specific example, IGBT die 204b of high side device 202b can be soldered or sintered to conductive layer 214b of high side substrate 230b. As another example, high side supply terminal $V_{H1}$ can be soldered or sintered to IGBT die 204a of low side device 202a. As a further example, gate terminal $G_{L1}$ and/or low side supply terminal $V_{L1}$ can be soldered or sintered to conductive layer 214b of high side substrate 230b. Also, IGBT die 204b of low side device 202a can be soldered or sintered to common conductive interface 240. By utilizing sinter or sinter alloy, power module 200 can advantageously avoid solder wear out.

FIG. 2B shows that common conductive interface 240 protrudes laterally from opposing sides of power module 200. For example, extension 240a of common conductive interface 240 protrudes laterally from side 252a of high side substrate 230a and low side substrate 230b. Extension 204b of common conductive interface 240 protrudes laterally from side 252b of high side substrate 230a and low side substrate 230b. In some embodiments, common conductive interface 240 protrudes from only one side power module 200, which can be a side other than sides 252a and 252b. As common conductive interface 240 is thermally conductive and is thermally coupled to high side device 202a and low side device 202b, heat from high side device 202a and low side device 202b can be effectively dissipated from extensions 240a and 240b of common conductive interface 240. Thus, common conductive interface 240 forms a heat sink for high side device 202a and low side device 202b, thereby enhancing heat dissipation capabilities of power module 200.

Also shown in FIG. 2B, gate terminal $G_{L1}$ and low side supply terminal $V_{L1}$ protrude laterally from side 254a of high side substrate 230a and low side substrate 230b. Gate terminal $G_{H1}$ and low side supply terminal $V_{L1}$ protrude laterally from side 254b of high side substrate 230a and low side substrate 230b. Sides 254a and 254b are opposing one another. It is noted that in other embodiments, the arrangement of terminals shown in FIG. 2B can be different. For example, any combination of gate terminals $G_{H1}$ and $G_{L1}$, high side supply terminal $V_{H1}$, low side supply terminal $V_{L1}$, and extensions 240a and 240b can protrude from any combination of sides 252a, 252b, 254a, and 254b.

Power module 200 can also include other connections and/or terminals not shown in FIGS. 2A and 2B. The connections and/or terminals can be for additional electrical components in power module 200 that are not specifically discussed herein. In some embodiments, power module 200 includes a temperatures sensor. The temperature sensor can be, for example, within or outside of IGBT die 204a and/or 204b. Also in some embodiment, power module 200 includes a current sensor. The current sensor can, for example, similarly be within our outside of IGBT die 204a and/or 204b. Power module 200 can then include additional terminals and/or connections for the temperature sensor and/or current sensor.

Furthermore, it will be appreciated that in other embodiments, power module 200 can be configured differently than shown in FIGS. 2A and 2B. For example, in the present embodiment, IGBT dies 204a and 204b both have an emitter (i.e. emitters 218a and 218b) and a gate (i.e. gates 220a and 220b) on a top surface and a collector (i.e. collectors 216a and 216b) on a bottom surface. However, in other embodiments at least one of IGBT dies 204a and 204b can have a gate and a collector on a same surface. The manner in which IGBT dies 204a and 204b are connected can be adjusted accordingly. Thus, for example, in some embodiments, gate terminal $G_{H1}$ can be electrically connected to conductive layer 212a similar to how gate terminal $G_{L1}$ is electrically connected to conductive layer 214b, in the present embodiment. It is noted that gate terminal $G_{L1}$ is not electrically connected to conductive layer 214b in some embodiments.

FIGS. 2A and 2B illustrate that power module 200 can optionally include hermetic sealant 242, which preferably comprises a molding compound. Hermetic sealant 242 can also include underfill material, which is not shown in FIGS. 2A and 2B. FIGS. 2A and 2B show that hermetic sealant 242 encompasses power module 200, leaving gate terminals $G_{H1}$ and $G_{L1}$, high side supply terminal $V_{H1}$, low side supply terminal $V_{L1}$, and extensions 240a and 240b exposed for connection to other circuits. FIGS. 2A and 2B also show that conductive layers 234a and 234b are exposed through hermetic sealant 242. One or more heat sinks may be thermally connected to conductive layer 234a and/or 234b.

Thus, as described above, stacked half-bridge power module 200 has high side and low side devices 202a and 202b including IGBT dies 204a and 204b and diode dies 206a and 206b. IGBT dies 204a and 204b and diode dies 206a and 206b can be connected with low EMI and parasitics. Additionally, heat can easily be dissipated from IGBT dies 204a and 204b and diode dies 206a and 206b. As such, performance of IGBT dies 204a and 204b and diode dies 206a and 206b are not significantly limited by packaging. Furthermore, power module 200 can advantageously have a small form factor and high power density.

Figure 3:
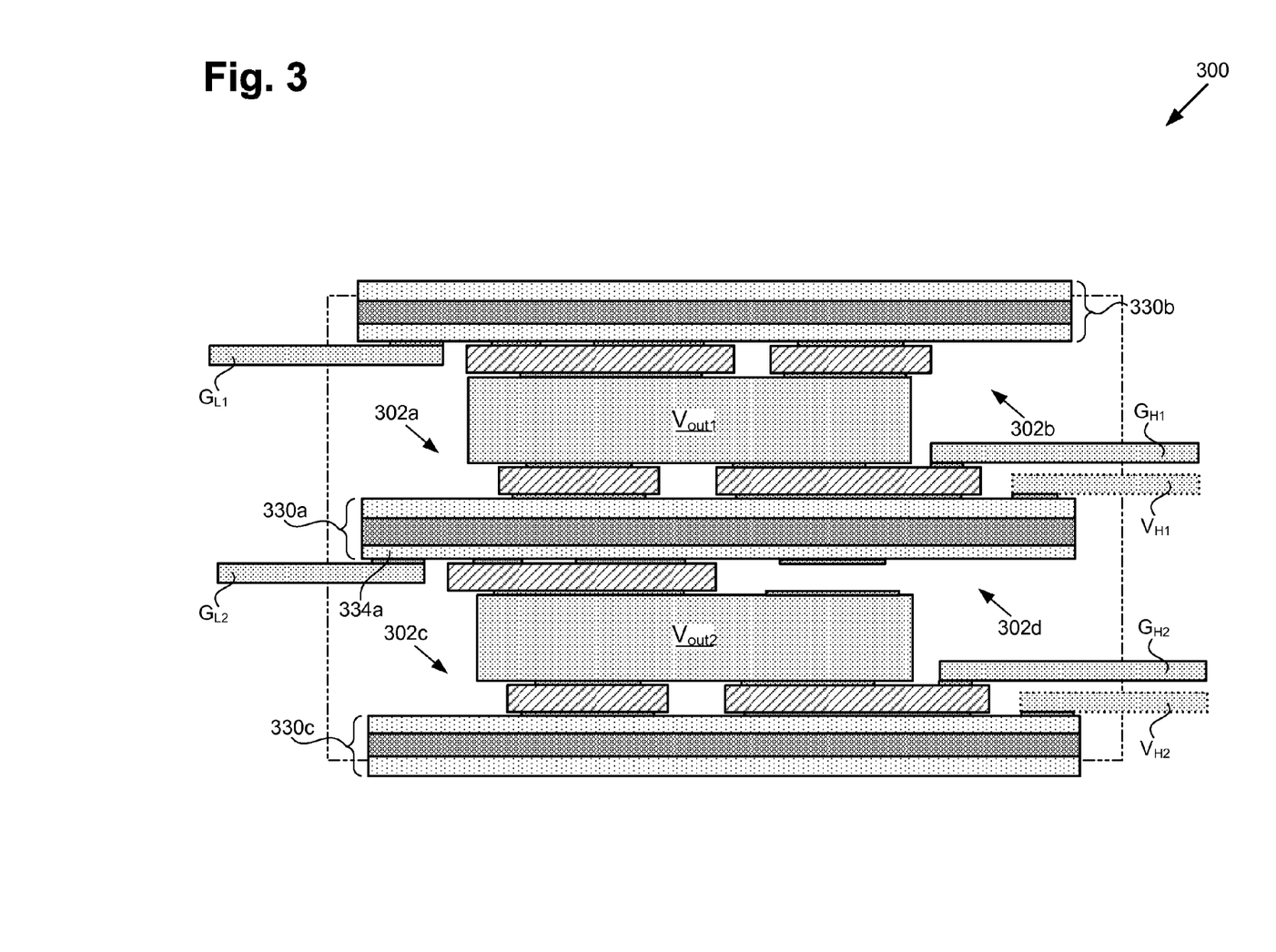
FIG. 3 illustrates a cross-sectional view of an exemplary stacked half-bridge power module, according to one embodiment of the present invention.

While power module 200 includes high side device 202a and low side device 202b as power devices, in other embodiments, power module 200 can have at least one additional power device or electrical component. For example, FIG. 3 shows stacked half-bridge power module 300 (also referred to herein as "power module"), according to one embodiment of the present invention. Power module 300 includes high side device 302a, low side device 302b, high side substrate 330a, low side substrate 330b, high side supply terminal $V_{H1}$, gate terminals $G_{H1}$ and $G_{L1}$, and half-bridge output terminal $V_{out1}$ corresponding respectively to high side device 202a, low side device 202b, high side substrate 230a, low side substrate 230b, high side supply terminal $V_{H1}$, gate terminals $G_{H1}$ and $G_{L1}$, and half-bridge output terminal $V_{out1}$ in FIGS. 1, 2A, and 2B. Power module 300 also includes a low side power terminal, corresponding to low side supply terminal $V_{L1}$ in FIGS. 2A and 2B, which is not shown in FIG. 3.

As shown in FIG. 3, power module 300 also includes power devices 302c and 302d. In the present embodiment, power device 302c is a high side device and power device 302d is a low side device. Power devices 302c and 302d form a half-bridge circuit similar to high side device 302a and low side device 302b. Thus, power module 300 includes high side supply terminal $V_{H2}$, gate terminals $G_{H2}$ and $G_{L2}$, and half-bridge output terminal $V_{out2}$ corresponding respectively high side supply terminal $V_{H1}$, and gate terminals $G_{H1}$ and $G_{L1}$ in FIGS. 1, 2A, and 2B. Power module 300 also includes a low side power terminal, corresponding to low side supply terminal $V_{L1}$ in FIGS. 1, 2A, and 2B, which is not shown in FIG. 3. This specific connections of power devices 302c and 302d will not be discussed in detail as they are similar to high side device 202a and low side device 202b in FIG. 2.

In some embodiments, the half-bridge circuit formed by power devices 302c and 302d is coupled to the half-bridge circuit formed by high side device 302a and 302b. For example, FIG. 1 shows high side supply bus 108 connecting high side supply terminals $V_{H1}$ and $V_{H2}$ and low side supply bus 110 connecting low side supply terminals $V_{L1}$ and $V_{L2}$, which correspond to similarly named terminals in FIG. 3. The half-bridge circuits can be connected, for example, to form a full-bridge circuit or respective phases of a multi-phase inverter circuit.

FIG. 3 illustrates that high side substrate 330a is a common substrate where power device 302d shares high side substrate 330a with high side device 302a. Both high side device 302a and power device 302d are on high side substrate 330a. Power device 302d has a power terminal (low side power terminal)

coupled to high side substrate 330a. In power module 300, power device 302d is electrically connected to conductive layer 334a of high side substrate 330a. As such, in the embodiment shown in FIG. 3, power module 300 includes additional power devices, without requiring an additional substrate (e.g. high side substrate 330a and low side substrate 330b) for each power device. For example, power module 300 includes two additional power devices compared to power module 200, but only requires substrate 330c, corresponding to high side substrate 230a in FIGS. 2A and 2B. In power module 300, power device 302c is on substrate 330c.

While in the present embodiment, power device 302d is a low side device, in other embodiments, power device 302d can be a high side device and power device 302c can be a low side device. Furthermore, power module 300 does not require both power devices 302d and 302c. As an example, in one embodiment, power device 302d is formed on substrates 330a and 330c without power device 302c. Also, it will be appreciated that power module 300 can include at least one power device in addition to those shown in FIG. 3. For example, in one embodiment, power module 300 is a three-phase inverter having six power devices and only four substrates (e.g. DBC substrates), similar to high side substrate 330a and low side substrate 330b.

Thus, as discussed above, in the embodiments of FIGS. 1 through 3, the present invention can provide for a stacked half-bridge power module having power devices that can be connected with low EMI and parasitics. Additionally, heat can easily be dissipated from the power devices. As such, performance of the power devices is not significantly limited by packaging. The stacked half-bridge power module can also have a small form factor and high power density.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A stacked half-bridge power module comprising:
a high side device having a high side power terminal of at least one die coupled to a high side substrate;
a low side device having a low side power terminal of at least another die coupled to a low side substrate;
said high side and low side devices being stacked over one another on opposite sides of a common conductive interface;
said common conductive interface, electrically, mechanically, and thermally coupling a high side output terminal of said high side device to a low side output terminal of said low side device;
said common conductive interface protruding from at least two sides of said high side substrate and said low side substrate.

2. The stacked half-bridge power module of claim 1, wherein said common conductive interface is a metal or a metal alloy.

3. The stacked half-bridge power module of claim 1, wherein said common conductive interface forms a heat sink for said high side device and said low side device.

4. The stacked half-bridge power module of claim 1, wherein said high side device and said low side device each include an insulated-gate bipolar transistor (IGBT) in parallel with a diode.

5. The stacked half-bridge power module of claim 1, wherein said high side device is on said high side substrate and said low side device is on said low side substrate.

6. The stacked half-bridge power module of claim 1, wherein said high side substrate and said low side substrate are thermally conductive.

7. The stacked half-bridge power module of claim 1, wherein said high side substrate comprises a high side conductive layer that is electrically insulated from said high side device and said low side substrate comprises a low side conductive layer that is electrically insulated from said low side device.

8. The stacked half-bridge power module of claim 1, wherein said low side device has a gate coupled to said low side substrate.

9. The stacked half-bridge power module of claim 1, wherein said high side output terminal is formed by said at least one die stacked on one side of said common conductive interface and said low side output terminal is formed by said at least another die stacked on another side of said common conductive interface that is opposite to said one side.

10. The stacked half-bridge power module of claim 1, wherein said high side device is sintered to said high side substrate.

11. A stacked half-bridge IGBT/diode power module comprising:
a high side IGBT/diode device having a collector terminal of at least one die coupled to a high side substrate;
a low side IGBT/diode device having an emitter terminal of at least another die coupled to a low side substrate;
said high side IGBT/diode device and said low side IGBT/diode device being stacked over one another on opposite sides of a common conductive interface;
said common conductive interface electrically, mechanically, and thermally coupling an emitter/anode terminal of said high side IGBT/diode device to a collector/cathode terminal of said low side IGBT/diode device;
said common conductive interface protruding from at least two sides of said high side substrate and said low side substrate.

12. The stacked half-bridge IGBT/diode power module of claim 11, wherein said common conductive interface is a metal or a metal alloy.

13. The stacked half-bridge IGBT/diode power module of claim 11, wherein said common conductive interface forms a heat sink of said high side IGBT/diode device and said low side IGBT/diode device.

14. The stacked half-bridge IGBT/diode power module of claim 11, wherein said high side IGBT/diode device and said low side IGBT/diode device each include an IGBT in parallel with a diode.

15. The stacked half-bridge IGBT/diode power module of claim 11, wherein said high side IGBT/diode device is on said high side substrate and said low side IGBT/diode device is on said low side substrate.

16. The stacked half-bridge IGBT/diode power module of claim 11, wherein said high side substrate and said low side substrate are thermally conductive.

17. The stacked half-bridge IGBT/diode power module of claim 11, wherein said high side substrate comprises a high side conductive layer that is electrically insulated from said high side IGBT/diode device and said low side substrate comprises a low side conductive layer that is electrically insulated from said low side IGBT/diode device.

18. The stacked half-bridge IGBT/diode power module of claim 11, wherein said collector terminal is a collector/cathode terminal of said high side IGBT/diode device and said emitter terminal is an emitter/anode terminal of said low side IGBT/diode device.

19. The stacked half-bridge IGBT/diode power module of claim 11, wherein said emitter/anode terminal is formed by said at least one die stacked on one side of said common conductive interface and said collector/cathode terminal is formed by said at least another die stacked on another side of said common conductive interface that is opposite to said one side.

20. The stacked half-bridge IGBT/diode power module of claim 11, wherein said high side IGBT/diode device is sintered to said high side substrate.

* * * * *